United States Patent [19]

Ijntema

[11] Patent Number: 4,536,757
[45] Date of Patent: Aug. 20, 1985

[54] DEVICE FOR SIGNALLING A SPECIFIC CHARGE CONDITION OF AN ACCUMULATOR BATTERY

[75] Inventor: Johannes Ijntema, Drachten, Netherlands

[73] Assignee: U.S. Philips Corporation, New York, N.Y.

[21] Appl. No.: 554,744

[22] Filed: Nov. 23, 1983

[30] Foreign Application Priority Data

Nov. 30, 1982 [NL] Netherlands .................. 8204628

[51] Int. Cl.³ .............................................. G08B 21/00
[52] U.S. Cl. ...................................... 340/636; 320/48; 324/433
[58] Field of Search .................... 340/636; 320/48; 324/433; 30/45

[56] References Cited

U.S. PATENT DOCUMENTS 4,356,481 10/1982 Kuki ................................... 340/636

Primary Examiner—James L. Rowland
Assistant Examiner—Daniel Myer
Attorney, Agent, or Firm—Robert T. Mayer; Bernard Franzblau

[57] ABSTRACT

A device for signalling a specific charge condition of an accumulator battery (B) comprises a comparator circuit (C) for comparing the battery voltage ($V_B$) with a reference voltage. A switching circuit ($G_2$, $G_{13}$) is controlled by the comparator circuit and an indicator ($L_1$, $L_2$, $L_s$) is in turn controlled by the switching circuit. A memory circuit (FF) ensures that the indicator remains energized for a specific time interval after the apparatus has been switched off.

15 Claims, 4 Drawing Figures

DEVICE FOR SIGNALLING A SPECIFIC CHARGE CONDITION OF AN ACCUMULATOR BATTERY

This invention relates to a device for signalling a specific charge condition of an accumulator battery incorporated in a battery-powered apparatus, which device comprises a comparator circuit for comparing the battery voltage with a reference voltage, a switching circuit controlled by the comparator circuit, and an indicator controlled by the switching circuit.

An accumulator battery generally comprises at least two storage cells, but the accumulator battery intended here may also comprise a single storage cell.

Devices of the type specified in the opening paragraph are known in many forms. By way of example reference is made to the German Patent Application No. 2,517,138, which has been laid open to public inspection. In the device described therein a series arrangement of a resistor and a capacitor is connected in parallel with the accumulator battery. The voltage across the resistor is applied to a Schmitt-trigger circuit, which performs the functions of comparator circuit and switching circuit. The reference voltage is the sum of the base-emitter threshold voltage of a first transistor of the trigger circuit and the voltage across a diode in the common emitter path of the two transistors of the Schmitt-trigger circuit. As soon as the voltage across the accumulator battery has decreased so far that the voltage applied to the Schmitt-trigger circuit is lower than the reference voltage, the second transistor of the trigger circuit will be turned on so that a light-emitting diode arranged in the collector circuit of this transistor lights up.

Such a device may be employed in a shaver which is powered by a built-in rechargeable battery of storage cells, for example Ni-Cd cells, for signalling the charge condition of these cells. However, this has one disadvantage. During shaving the shaver is held against the skin so that if the light-emitting diode lights up during shaving, it is generally not noticed by the user. Since the shaver is switched off before it is put away, so that the light-emitting diode also extinguishes, it is no longer possible to see after use whether the accumulator battery must be recharged before the following shave.

It is an object of the present invention to mitigate the above-mentioned drawbacks. According to the invention the device is therefore characterized in that there is provided a memory circuit which ensures that the indicator remains energized for a specific time interval after the apparatus has been switched off.

Now the user of the apparatus has an indication, for example for at least a few seconds after the apparatus has been switched off, whether recharging is necessary.

The signalling point, i.e. the charging level of the battery at which the switching circuit responds, may be selected so that at the instant of signalling the battery charge is still sufficient for a complete shave.

Switching on of the motor of the apparatus or a brief heavy load on the motor may be attended by a brief current surge. In order to preclude the energization of the indicator in response to the accompanying brief but large voltage drop across the accumulator battery, a device in accordance with the invention may further be characterized in that there is provided a time-threshold circuit which inhibits the response of the switching circuit for the indicator to a brief voltage drop across the battery.

It is to be noted that U.S. Pat. No. 3,852,732 describes a charge-condition indicator which comprises means which preclude a permanent indication that the charging level of the accumulator battery has dropped below a reference level as a result of a brief voltage drop across the battery, for example when the motor is switched on. However, in the known device the indicator does not remain energized after the apparatus has been switched off.

A preferred device in accordance with the invention is further characterized in that the time-threshold circuit comprises a first logic gate, which is controlled by the comparator circuit, and an up/down pulse counter whose count-up and count-down inputs are connected to separate outputs of the logic gate, to which logic gate the pulses from a pulse generator are applied. The memory circuit comprises a bistable multivibrator whose set input and reset input are controlled by the pulse counter, and the switching circuit, which is connected to the output of the multivibrator, comprises a plurality of logic gates.

In this device the pulses from the pulse generator will be transferred to the pulse counter via a gate circuit if the voltage across the accumulator has decreased below a specific level. At the instant that the pulse counter has counted a certain number of pulses corresponding to, for example, two seconds, a set signal is applied to the bistable multivibrator, causing a light-emitting diode to light up via a number of logic gates. Voltage drops of a duration smaller than the specified time interval of, for example, two seconds will not cause the diode to light up. If the apparatus is switched off after the bistable multivibrator has been set, the pulse counter starts a new counting cycle until, for example, four or more seconds have elasped. After this the pulse counter supplies a reset signal to the bistable. During the last-mentioned time interval the indicator will blink.

It is to be noted that in U.S. Pat. No. 3,877,001 a charge condition indicator is described which employs a light-emitting diode which can light up both continuously and intermittently. In the known device, however, the diode is used in a different way. As long at the voltage across the accumulator battery remains above a specific level the diode will be lit continuously, whereas the diode blinks if the voltage across the accumulator battery is lower than the reference voltage. The device described in U.S. Pat. No. 3,877,001 does not have a memory function and has a different construction. For example, this known device does not comprise a pulse generator and a pulse counter.

An embodiment of the invention in which the indicator comprises at least one light-emitting element may be characterized in that there is provided a second bistable multivibrator whose set input is connected to that pulse-counter output which is connected to the set input of the first bistable multivibrator. The reset input of the second bistable multivibrator is connected to a point in a charging circuit of the accumulator battery for receiving a signal at the instant that charging begins. The output of the second bistable multivibrator is connected to the reset input of the first bistable multivibrator via an additional logic gate.

The memory circuit comprising the second bistable multivibrator and the additional logic gate ensures that, if during shaving the charge of the accumulator battery has been below the reference level for a sufficiently long time and the apparatus has been put away without being recharged, the user is given an indication that recharging is necessary when the apparatus is switched on for the next shave.

An embodiment of the invention, in which the indicator comprises an acoustic element may be characterized in that there is provided an additional logic gate having a first input is connected to a pulse-counter output which supplies a signal of comparatively low frequency and having a second input is connected to an output of a frequency divider which supplies a signal of comparatively high frequency and which is arranged in the pulse generator. The output of the additional logic gate is connected to the acoustic element via a plurality of logic gates at the instant that the apparatus is switched off.

If in this apparatus the voltage across the accumulator battery has been below a reference level for a sufficiently longtime during use, an acoustic alarm is switched on at the instant that the apparatus is switched off. The acoustic alarm remains operative for some time after this occurs, for example four seconds.

It is to be noted that from U.S. Pat. No. 4,284,944 it is known per se to employ an acoustic alarm in a charging device in order to indicate whether the charging condition of an accumulator battery is poor or satisfactory. However, in that known device the acoustic alarm only remains switched on as long as the apparatus is switched on, so that the alarm signal may be drowned out in the motor noise.

A device in accordance with the invention may comprise both a visual indicator and an acoustic indicator.

The invention will now be described in more detail, by way of example, with reference to the drawings.

Figure 1:
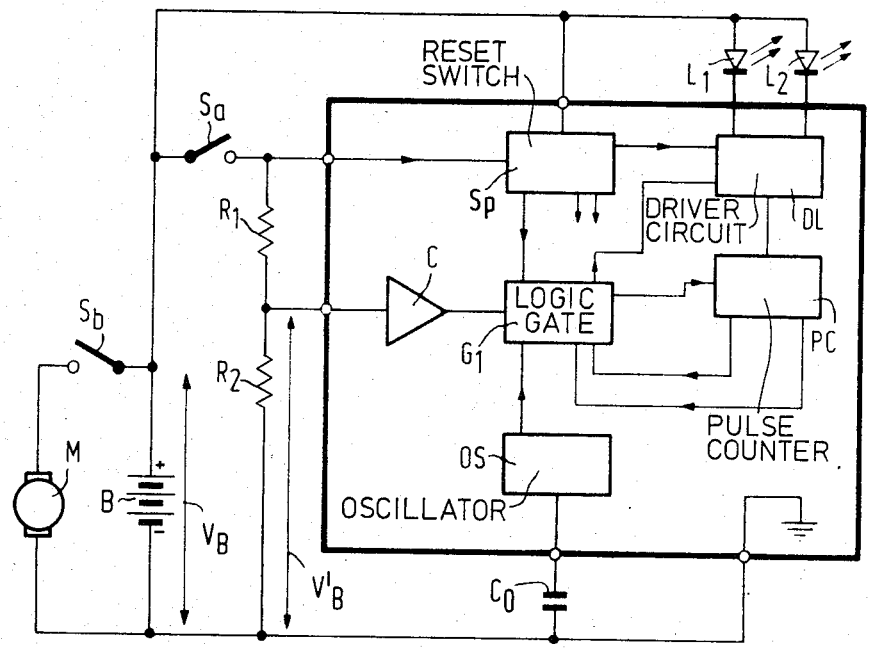
FIG. 1 is a block diagram of a first embodiment of the invention.

In FIG. 1 an accumulator battery comprising for example two Ni-Cd cells is designated by B, which battery furnishes the supply voltage for the motor M of, for example, a shaving apparatus. $S_b$ is a switch by means of which the current to the motor can be interrupted, in other words by means of which the apparatus can be switched off. A voltage divider is arranged in parallel with the accumulator battery, which divider comprises in this example two resistors $R_1$ and $R_2$. A fraction $V_B'$ of the voltage $V_B$ across the accumulator battery is compared with a reference voltage which is independent of the supply voltage and which appears in the comparator circuit C. As soon as the voltage $V_B'$ becomes lower than the reference voltage, the output voltage of the comparator circuit C will change. Via a logic gate $G_1$ this causes an oscillator OS provided with an oscillator capacitor CO to supply pulses to a pulse counter PC, which counts the pulses and thus measures the time which has elapsed since the instant at which the voltage $V_B'$ became smaller than the reference voltage.

If the voltage $V_B'$ has been smaller than the reference voltage for, for example, two seconds one of the two light-emitting diodes $L_1$ and $L_2$ will be caused to light up continuously via a driver circuit DL. If within these two seconds the voltage $V_B'$ again becomes higher than the reference voltage, the pulse counter will receive a signal via the logic gate $G_1$ such that the counter will count down to zero. Voltage drops across the accumulator battery which are shorter than two seconds therefore will not cause one of the diodes $L_1$ and $L_2$ to light up. If the switches $S_a$ and $S_b$ are opened, in other words if the apparatus is switched off, while one of the diodes $L_1$ and $L_2$ is lit, these diodes will be turned on and turned-off alternately for example for four seconds, so that a blinking signal is generated having a frequency of, for example, 2 Hz. The four-second time interval is measured by the same elements by means of which the twoseconds time interval is measured, namely by means of the oscillator OS and the pulse counter PC. When the four seconds have elapsed the logic circuit is switched off automatically, after which only a leakage current which is substantially smaller than for example one tenth of the self-discharging current of the accumulator battery flows through the system, which minimizes the battery drain.

Instead of two light-emitting diodes it is also possible to use only one such doide.

Except for the voltage divider $R_1$, $R_2$, the oscillator capacitor CO and the two diodes $L_1$ and $L_2$, the entire circuit may be constructed as an integrated circuit, as is indicated by the heavy line in FIGS. 1, 2, 3 and 4.

Figure 2:
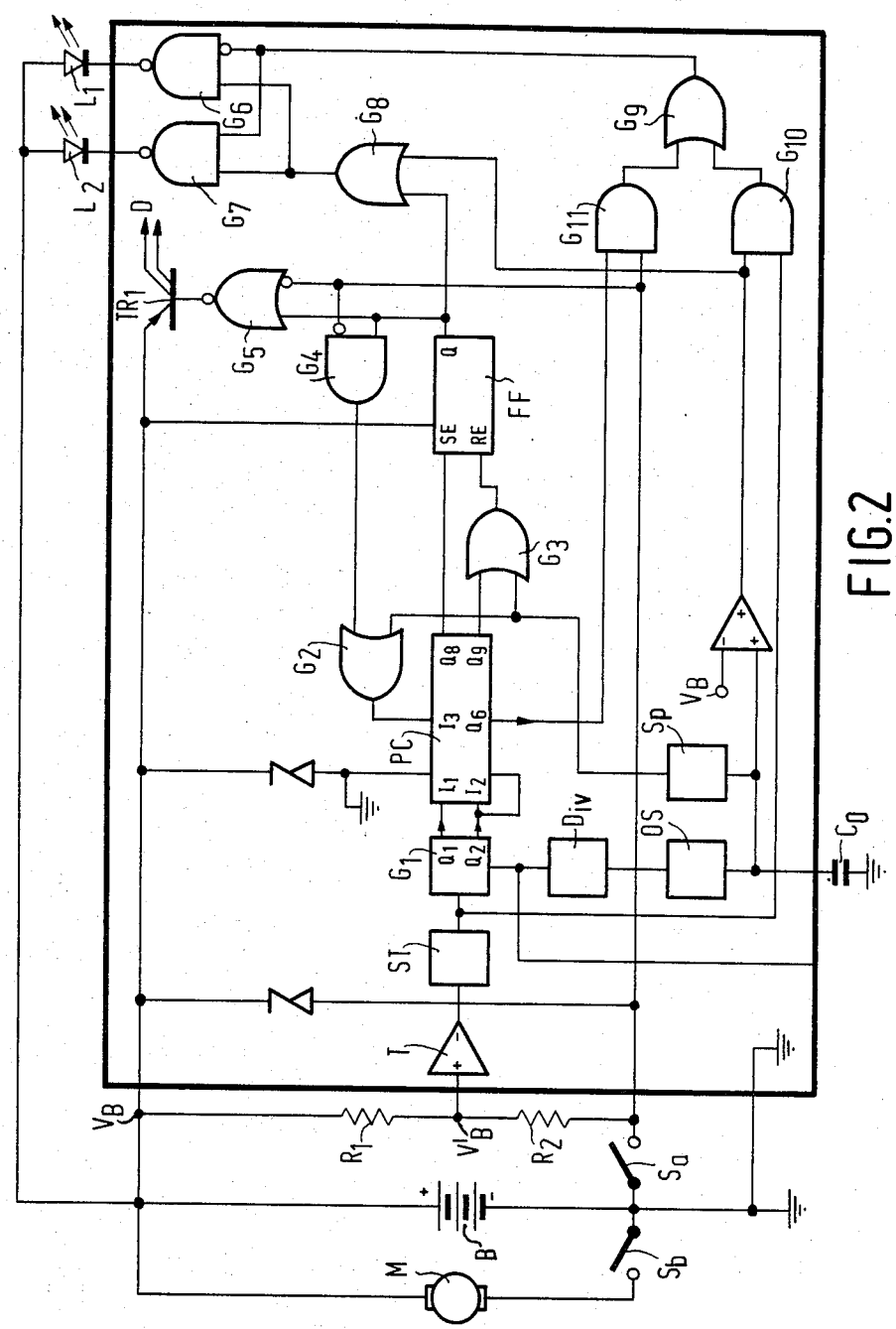
FIG. 2 shows this embodiment in more detail.

The device shown in FIG. 1 is shown in more detail, in FIG. 2, the elements of the driver circuit DL also being shown. The comparator in this example comprises a first trigger circuit T and a second trigger circuit (Schmitt trigger) ST, which sharpens the edges of the signal supplied by the trigger circuit T. The resulting signal controls a logic circuit which includes the logic gate $G_1$, the pulse counter PC, a bistable multivibrator FF and a plurality of logic gates $G_2$ to $G_{11}$. The pulse counter has a count-up input $I_1$ which is connected to a first output $Q_1$ of the gate $G_1$ and a count-down input $I_2$ which is connected to a second output $Q_2$ of the logic gate $G_1$. Depending on the signal of the input of the gate G'pulses are applied to the count-up input or to the count-down input of the pulse counter. The device further comprises a frequency divider DIV which divides the frequency of the pulses supplied by the oscillator OS by a specific number.

When the apparatus is switched-on, i.e. when the motor M is connected across the battery via the switch $S_b$ and the charge-condition indicator is connected across the battery via the switch $S_a$, and part $V_B'$ of the battery voltage $V_B$ is compared with a temperature-independent threshold voltage of, for example, 1.25 V.

If the voltalge $V_B'$ is lower than the threshold voltage the circuit ST changes to a state in which its output goes low ("0"). As a result of this, the gate $G_1$ is controlled so that the pulses from the oscillator are transferred to the count-up input $I_1$ of the pulse counter via the output $Q_1$. An output $Q_8$ of this counter is connected to a set input of the bistable multivibrator FF.

If the output $Q_8$ becomes high ("1") before $V_B'$ increases above the reference level, the multivibrator is set, its output Q going high ("1"). The light-emitting diode $L_1$ is turned on via an OR-gate $G_8$ and a NAND-gate $G_6$ having an inverting input. The output Q of the bistable is also connected to an AND-gate $G_4$ having an inverting input and having its output connected to a further OR-gate $G_2$. The signal from the last-mentioned gate is applied to a reset input $I_3$ of the pulse counter. This ensures that the counter is reset to zero when it has counted a number of pulses corresponding to, for example, two seconds. In an embodiment in which the oscillator OS has a frequency of 8200 Hz and the frequency divider DIV divides by 64, the state of the multivibrator FF is changed over after 256 pulses, which corresponds to two seconds.

If the voltage $V_B'$ has become higher than the reference level before the desired number of pulses corresponding to, for example, two seconds has been counted, the logic gate $G_1$ is controlled so that the pulses are applied to the count-down input of the pulse conter PC via the output $Q_2$. The counter then counts down so that the output $Q_8$ of the pulse counter does not become high, the multivibrator FF is not set, and consequently the diode $L_1$ does not light up. The pulse counter continues to count down until its count has become zero or until the voltage $V_B'$ again exceeds the reference level and the pulses are again applied to the count-up input $I_1$ via output $Q_1$.

The use of a counter which both counts up and counts down has an integrating effect. In the case of a battery voltage on which a sawtooth-shaped ripple is superimposed because it is loaded by a collector motor, averaging will be effected at the mean value of the battery voltage.

When the apparatus is switched off, i.e. when the switches $S_a$ and $S_b$ are opened, while the multivibrator FF is set, the output of ST is pulled low ("0") and the pulse counter is started via gates $G_4$ and $G_2$ until the output $Q_9$ goes high ("1"). At the instant, for example, four seconds have elapsed. Output $Q_9$ is connected to the reset input RE of the bistable multivibrator FF via an OR-gate $G_3$ so that at said instant, the multivibrator is reset and the diodes $L_1$ and $L_2$ are turned off.

During said time interval of, for example, four seconds the two diodes $L_1$ and $L_2$ are alternately turned on and turned off. The pulses for this are supplied by the output $Q_6$ of the pulse counter and are transferred to the diodes $L_1 L_2$ via an AND-gate $G_{11}$, the OR-gate $G_9$, the NAND-gate $G_7$ and the NAND-gate $G_6$ with inverting input. The output $Q_6$ of the pulse counter PC can supply a signal of a frequency of, for example, 2 Hz, so that the diodes $L_1$ and $L_2$ will blink with a period of 500 msecs.

When a different oscillator frequency is used the afore-mentioned time intervals of four seconds, two seconds and five hundred millseconds will be changed while maintaining the ratio between these time intervals.

The logic circuit is energized via the transistor $TR_1$ which is driven by the NOR-gate $G_5$ having an inverting input. In a manner not shown, the outputs D of this transistor are connected to the separate elements of the logic circuit. This logic circuit is connected to the power-supply voltage when the switch $S_a$ is closed or when the bistable multivibrator is in the set condition. If neither of these conditions is met no current will flow through $TR_1$ and the logic circuit will not be energized. Then only a very small leakage current will flow through the circuit.

When the switch $S_a$ is closed, the voltage across the capacitor $C_o$ will lag the supply voltage as a result of the lag produced by the capacitor. As a result of this lag between the supply voltage VB and the voltage across the capacitor $C_o$, the switch SP, which may be called a logic-circuit reset switch, will supply a pulse. The switch SP supplies this pulse to the reset input $I_3$ of the pulse counter via the gate $G_2$ so that this counter is set to zero. Moreover, the switch SP supplies a pulse to the reset input RE of the multivibrator FF via the gate $G_3$ so that this multivibrator is reset. The switch $S_b$, which switches on the motor, is activated simultaneously with the switch $S_a$.

Figure 3:
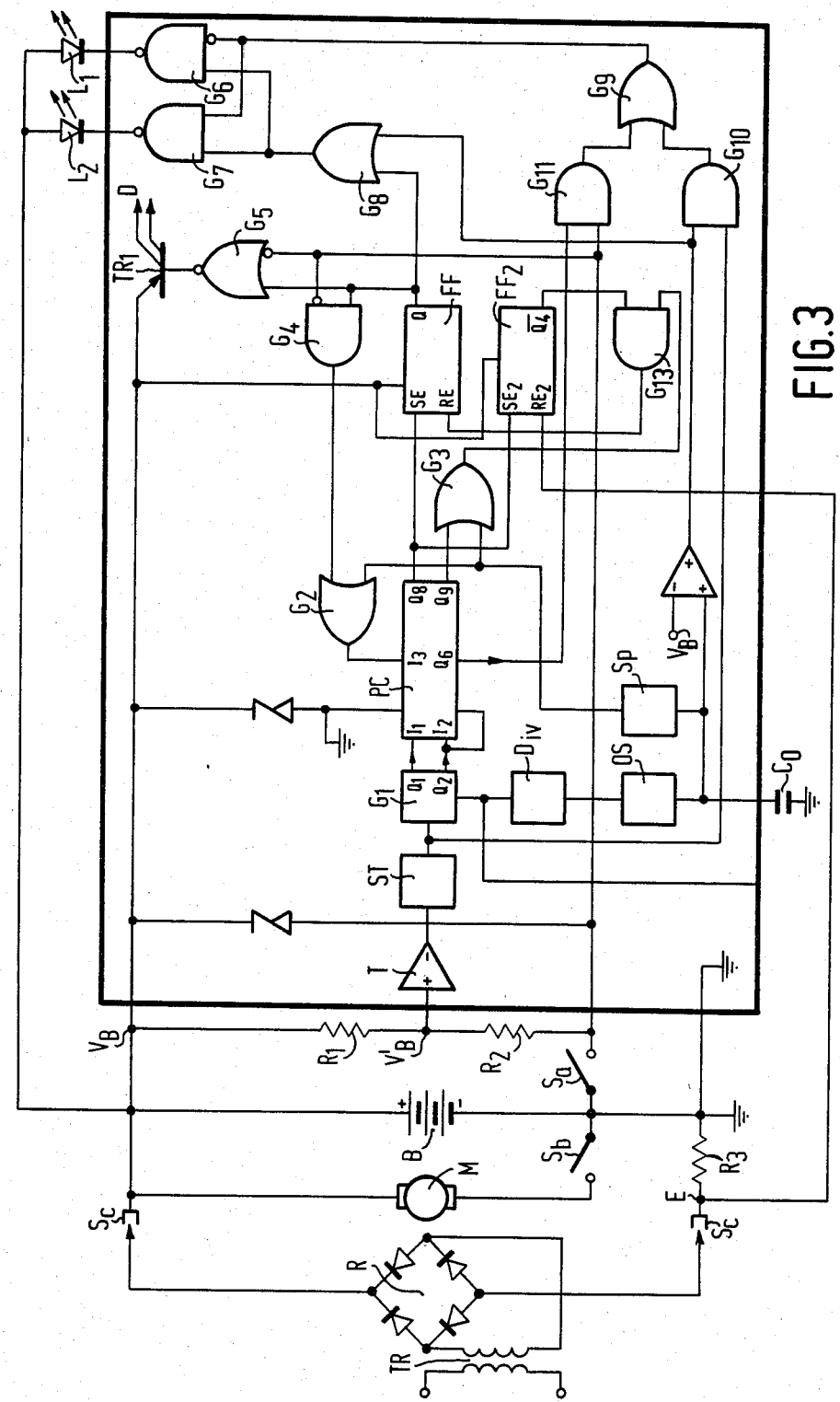
FIG. 3 shows this embodiment extended with a second memory.

FIG. 3 shows the embodiment of FIG. 2 extended to have an additional long-term memory function. This function is obtained by means of a second bistable multivibrator $FF_2$ and an AND-gate $G_{13}$. The set input of the second multivibrator is connected to the output $Q_8$ of the pulse counter PC, whereas the reset input of this multivibrator is connected to a point E in the charging circuit of the accumulator battery. The charging device may comprise, in known manner, a transformer TR and a full-wave rectifier R and may be connected to the accumulator battery via the switches $S_c$. The output $\overline{Q}_4$ of the bistable multivibrator $FF_2$ is connected to a first input of the AND-gate $G_{13}$ and the second input of this gate is connected to the output of the OR-gate $G_3$.

When the output $Q_8$ of the pulse counter PC goes high ("1"), i.e. at the instant that the battery voltage has been too low for longer than two seconds, both the second bistable multivibrator $FF_2$ and the first bistable multivibrator FF are set. The second bistable can be reset only by a signal at its reset input $RE_2$, which signal appears when the battery charger is connected. The multivibrator $FF_2$ and the AND-gate $G_{13}$ together ensure that once the output $QW_8$ of the pulse counter has been high and the multivibrator FF has been set, this information is retained, even when the apparatus is switched off and the diodes $L_1$ and $L_2$ have stopped blinking. The multivibrator $FF_2$ and the AND-gate $G_{13}$ prevent the multivibrator FF from beig reset via the switch SP and the OR-gate $G_3$ when the apparatus is switched on again, i.e. when the switches $S_a$ and $S_b$ are closed.

As long as no recharging is effected the multivibrator $FF_2$ will store the last state of the multivibrator FF and, if the output of this multivibrator has been high during previous use, the multivibrator $FF_2$ will ensure that the "battery-drained" signal is given when the apparatus is used the next time.

Figure 4:
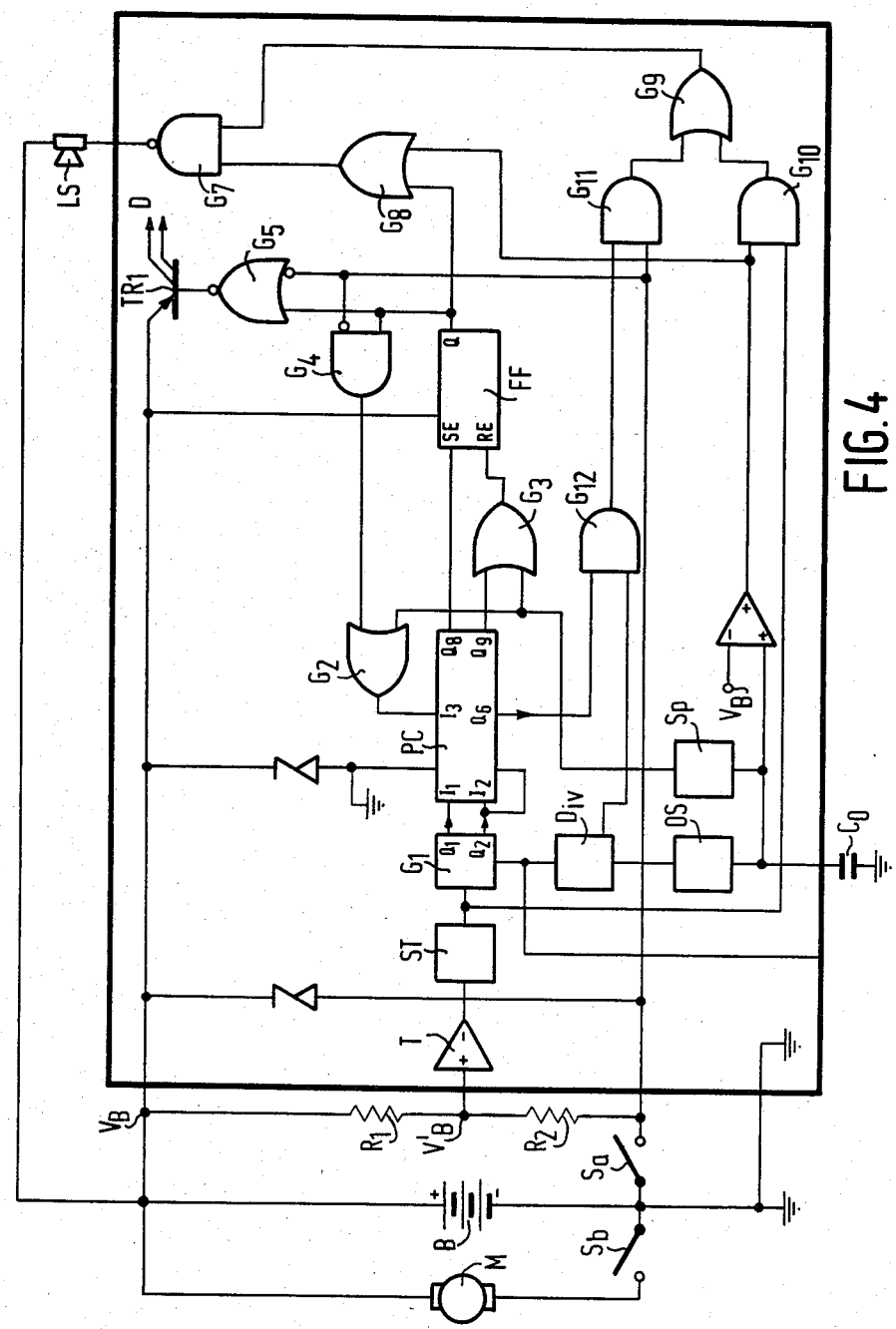
FIG. 4 shows an embodiment equipped with an acoustic alarm.

FIG. 4 shows a charge-condition indicator device in which the indicator is an acoustic element, which is schematically represented by a loudspeaker LS. In the device shown in FIG. 4 the two light-emitting diodes $L_1$ and $L_2$ and the gate $G_6$ of the device shown in FIG. 2 are not present and an additional AND-gate $G_{12}$ is present. A first input of this gate is connected to the output $Q_6$ of the pulse counter PC, while the second input is connected to an additional output of the frequency divider DIV. This output supplies a signal of a frequency of, for example, 2000 Hz.

By applying this signal together with the signal of, for example, 2 Hz appearing at the output $Q_6$ of the pulse counter to the AND-gate $G_{12}$, a signal having a frequency of 2000 Hz will appear at the output of this gate. This signal is interrupted at a rate of 2 Hz. Via the AND-gate $G_{11}$ and the OR-gate $G_9$ this signal is applied to the NAND-gate $G_7$. If during use of the apparatus, i.e. when the switch $S_a$ is closed, the multivibrator FF is set because the voltage $V_B'$ has been below the reference level for more than two seconds, then the NAND-gate $G_7$ will be controlled via the OR-gate $G_8$, after the apparatus has been switched off, such that the 2000 Hz signal (which is interrupted at a rate of 2 Hz) is applied to the loudspeaker LS. A sound signal will then be produced for, for example, four seconds.

Alternatively, it is possible to incorporate both a loudspeaker and one or two light-emitting diodes in one indicator device. Thus, after the apparatus has been switched on, both an acoustic signal and a light signal are produced if, during the preceding use, the voltage $V_B'$ has been lower than the reference level for at least two seconds. This device will again comprise a gate $G_6$ as shown in FIGS. 2 and 3.

The invention has been described for a shaving apparatus, but it is obvious that it may also be employed in other equipment powered by rechargeable accumulator batteries. For example, the invention may be employed in appliances which are hand-held in use, such as mixers and drills. In that case a visual indicator may be covered or an acoustic indicator signal may be drowned out in the motor noise. However, the invention may equally be used in non-portable appliances such as vacuum cleaners or lawn-mowers, which during use are situated at some distance from the user's ears or eyes. Preferably, the indicator is then arranged near the on-off button, so that the user will automatically notice the indicator when the apparatus is switched off.

What is claimed is:

1. A device for signalling a specific charge condition of an accumulator battery incorporated in a battery-powered apparatus, which device comprises a comparator circuit for comparing the battery voltage with a reference voltage, a switching circuit controlled by the comparator circuit into a first state when the battery voltage drops below a given voltage level, an indicator controlled by the switching circuit, and a memory circuit coupled to the switching circuit, said memory circuit including time delay means for maintaining the indicator energized for a specific time interval after the apparatus has been switched off provided the switching circuit is in the first state when the apparatus is switched off.

2. A device as claimed in claim 1 further comprising a time-threshold circuit coupled to the switching circuit so as to inhibit the response of the switching circuit in the event of a brief voltage drop across the battery.

3. A device as claimed in claim 2 wherein the time-threshold circuit comprises a first logic gate controlled by the comparator circuit, an up/down pulse counter having a count-up input and a count-down input connected to separate outputs of the logic gate, a pulse generator which applies pulses to the first logic gate, the memory circuit comprising a bistable multivibrator having a set input and a reset input controlled by the pulse counter, and wherein the switching circuit is connected to the output of the multivibrator and comprises a plurality of logic gates.

4. A device as claimed in claim 3 wherein the indicator comprises at least one light-emitting element, said device further comprising a second bistable multivibrator having a set input connected to that pulse-counter output which is connected to the set input of the first multivibrator, first means connecting a reset input of the second bistable multivibrator to a circuit point in a charging circuit of the accumulator battery for receiving a signal at the instant that battery charging begins, and second means connecting an output of the second bistable multivibrator to the reset input of the first bistable multivibrator via an additional logic gate.

5. A device as claimed in claim 3 wherein the indicator comprises an acoustic element, an additional logic gate having a first input connected to a pulse-counter output which supplies a signal of comparatively low frequency and having a second input connected to an output of a frequency divider which supplies a signal of a comparatively high frequency, said frequency divider being arranged in the pulse generator, and means connecting an output of the additional logic gate to the acoustic element via a plurality of logic gates at the instant that the apparatus is switched off.

6. A device as claimed in claim 5 further comprising a visual indicator including at least one light-emitting element which emits a light signal after the apparatus has been switched off.

7. A shaver comprising a motor, an accumulator battery coupled to the motor via a switch, and a device as claimed in claim 1 coupled to the accumulator battery for signalling a given charge condition of the accumulator battery.

8. A device for monitoring the voltage of a battery used as an energy source in a battery-powered apparatus comprising: a comparator circuit for comparing the battery voltage with a reference voltage indicative of a minimum desired battery voltage level, said comparator circuit having an input coupled to the battery via a switching means that switches the apparatus on and off, a switching circuit, an indicator device controlled by said switching circuit to develop an alarm indication when the switching circuit is in a first state, means for coupling an output of the comparator circuit to an input of the switching circuit so as to control the switching circuit into the first state when the battery voltage falls below said minimum desired battery voltage level for a given time period, and a memory circuit responsive to an output of the coupling means for delaying the switching of the switching circuit from the first state to a second state for a specific time interval after said apparatus has been switched off by said switching means.

9. A device as claimed in claim 8 wherein said coupling means includes a time-threshold circuit which inhibits the operation of the switching circuit into said first state in the event of a drop in the voltage from said battery at the comparator input below said minimum desired voltage level for a time period less than a preselected time interval.

10. A device as claimed in claim 9 wherein the time-threshold circuit comprises a first gate circuit controlled by the output of the comparator circuit, an up/down pulse counter having a count-up input and a count-down input coupled to first and second outputs of the first gate circuit, respectively, a pulse generator coupled to an input of the first gate circuit, and wherein the memory circuit comprises a bistable device controlled by the pulse counter and having an output for controlling the switching circuit.

11. A device as claimed in claim 9 wherein the time-threshold circuit comprises a first gate circuit controlled by the output of the comparator circuit, an up/down pulse counter having a count-up input and a count-down input coupled to first and second outputs of the first gate circuit, respectively, a pulse generator coupled to an input of the first gate circuit, and wherein the memory circuit comprises a first bistable device having a set input coupled to a first output of the pulse counter, a second bistable device having a set input connected to the first output of the pulse counter, first means connecting a reset input of the second bistable device to a circuit point in a charge circuit of the battery thereby to receive a signal when the battery begins to charge, and a logic gate circuit coupling an output of the second bistable device and a second output of the pulse counter to the reset input of the first bistable device.

12. A device as claimed in claim 8 wherein the switching means comprises a first switching element for selectively connecting the battery to a part of said monitoring device and a second switching element for selectively connecting the battery to a load of the battery-powered apparatus.

13. A device as claimed in claim 8 wherein the switching means comprises a first switching element for selectively connecting the battery to a part of said monitoring device, and means coupled directly to the battery for supplying energizing voltages to at least the memory circuit and the switching circuit, said energizing voltage supplying means being controlled at least in part by an output of the memory circuit.

14. A battery-powered apparatus comprising:
a battery,
a load for energization by the battery,
a device for monitoring the battery voltage comprising:
a comparator circuit for comparing the battery voltage with a reference voltage indicative of a minimum desired battery voltage level, a switching circuit coupled to an output of the comparator circuit and controlled thereby into a first state when the battery voltage falls below said minimum desired battery voltage level, an indicator device controlled by said switching circuit to develop an alarm indication when the switching circuit is in said first state, and a memory circuit responsive to the output of the comparator circuit for delaying the switching of the switching circuit from the first state to a second state for a specific time interval after said apparatus has been switched off,
and switching means for selectively connecting the battery to said load and to said monitoring device thereby to switch the apparatus on and off.

15. A device for monitoring the voltage of a battery used as an energy source in a battery-powered apparatus comprising: switching means for connecting said device to the battery as long as the apparatus is switched on, a comparator circuit for comparing the battery voltage with a reference voltage, a switching circuit controlled by the comparator circuit and an indicator controlled by the switching circuit, and a memory circuit coupled between the comparator circuit and the switching circuit, said memory circuit comprising time delay means for delaying the switching off of the indicator for a specific time interval after the apparatus has been switched off.

* * * * *